(12) United States Patent
Suzuki et al.

(10) Patent No.: US 11,348,787 B2
(45) Date of Patent: May 31, 2022

(54) LASER IRRADIATION APPARATUS, LASER IRRADIATION METHOD, AND METHOD FOR MANUFACTURING SEMICONDUCTOR DEVICE

(71) Applicant: JSW AKTINA SYSTEM CO., LTD., Yokohama (JP)

(72) Inventors: Yuki Suzuki, Yokohama (JP); Takahiro Fuji, Yokohama (JP); Takahiro Mikami, Yokohama (JP); Yoshihiro Yamaguchi, Yokohama (JP); Ryo Shimizu, Yokohama (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 35 days.

(21) Appl. No.: 16/628,004

(22) PCT Filed: Feb. 16, 2018

(86) PCT No.: PCT/JP2018/005457
§ 371 (c)(1),
(2) Date: Dec. 31, 2019

(87) PCT Pub. No.: WO2019/038953
PCT Pub. Date: Feb. 28, 2019

(65) Prior Publication Data
US 2020/0219724 A1 Jul. 9, 2020

(30) Foreign Application Priority Data
Aug. 25, 2017 (JP) ............................. JP2017-162115

(51) Int. Cl.
*H01L 21/02* (2006.01)
*H01L 21/67* (2006.01)
*H01L 21/677* (2006.01)

(52) U.S. Cl.
CPC .. *H01L 21/02675* (2013.01); *H01L 21/67115* (2013.01); *H01L 21/67784* (2013.01)

(58) Field of Classification Search
CPC ............. H01L 21/677; H01L 21/67739; H01L 21/02675
See application file for complete search history.

(56) References Cited

U.S. PATENT DOCUMENTS

2002/0153360 A1\* 10/2002 Yamazaki ............. H01L 21/268
219/121.66
2004/0106242 A1\* 6/2004 Arao ................... B23K 26/0838
438/166

(Continued)

FOREIGN PATENT DOCUMENTS

JP 2002-231654 A 8/2002
JP 2007-027495 A 2/2007

(Continued)

OTHER PUBLICATIONS

International Search Report from International Patent Application No. PCT/JP2018/005457, dated Apr. 24, 2018.

*Primary Examiner* — Jae Lee
(74) *Attorney, Agent, or Firm* — SGPatents PLLC

(57) ABSTRACT

A laser irradiation apparatus (1) according to an embodiment includes a laser generation device (14) configured to generate laser light, and a levitation unit (10) configured to levitate an object to be processed (16) to which the laser light is applied. The levitation unit (10) includes a first area and a second area, and the first and second areas are arranged so that, in a plane view, a focal point of the laser light overlaps the first area and the focal point of the laser light does not overlap the second area. A surface part of the second area is formed of a metal member.

13 Claims, 11 Drawing Sheets

(56) References Cited

U.S. PATENT DOCUMENTS

| | | | |
|---|---|---|---|
| 2007/0017442 A1 | 1/2007 | Yamasaki et al. | |
| 2011/0042874 A1* | 2/2011 | Aoki | G03F 7/70791 29/559 |
| 2018/0033664 A1 | 2/2018 | Fuji et al. | |
| 2019/0164798 A1 | 5/2019 | Suzuki | |
| 2019/0193200 A1 | 6/2019 | Fuji et al. | |

FOREIGN PATENT DOCUMENTS

| | | |
|---|---|---|
| JP | 2007-230738 A | 9/2007 |
| JP | 2008-110852 A | 5/2008 |
| JP | 2009-117552 A | 5/2009 |
| JP | 5.512.052 B2 | 6/2014 |
| WO | WO 2016/136366 A1 | 9/2016 |
| WO | WO 2018/042796 A1 | 3/2018 |
| WO | WO 2018/042808 A1 | 3/2018 |

* cited by examiner

LASER IRRADIATION APPARATUS, LASER IRRADIATION METHOD, AND METHOD FOR MANUFACTURING SEMICONDUCTOR DEVICE

TECHNICAL FIELD

The present invention relates to a laser irradiation apparatus, a laser irradiation method, and a method for manufacturing a semiconductor device.

BACKGROUND ART

A laser irradiation apparatus that applies a laser beam to a plate-like workpiece while levitating and conveying the workpiece has been known. It should be noted that each of Patent Literatures 1 and 2 discloses a technique for levitating a plate-like workpiece by gas ejected upward from a horizontally-placed porous plate.

CITATION LIST

Patent Literature

Patent Literature 1: Japanese Unexamined Patent Application Publication No. 2008-110852
Patent Literature 2: Japanese Patent No. 5512052

SUMMARY OF INVENTION

Technical Problem

When a porous element is used in a levitation unit, particles are generated from the porous element. For example, when a crack or a chip occurs in the porous element, particles are generated from the part of the porous element where the crack or chip has occurred. Then, a leakage of air occurs in the part where the crack or chip has occurred and hence air is not uniformly ejected from the front surface of the porous element. Therefore, in some cases, a workpiece cannot be properly levitated. Other problems to be solved and novel features will become apparent from descriptions in this specification and accompanying drawings.

Solution to Problem

A laser irradiation apparatus according to an embodiment includes a levitation unit configured to levitate an object to be processed to which laser light is applied, in which a surface part of a second area of the levitation unit is formed of a metal member.

Advantageous Effects of Invention

According to the embodiment, it is possible to provide a laser irradiation device, a laser irradiation method, and a method for manufacturing a semiconductor device capable of suppressing the generation of particles.

DESCRIPTION OF EMBODIMENTS

A laser irradiation apparatus, a laser irradiation method, and a method for manufacturing a semiconductor device according to this embodiment will be described hereinafter with reference to the drawings. Note that the following explanation is given on the assumption that an object to be processed to which laser light is applied is a glass substrate coated with an amorphous silicon film. However, the object to be processed is not limited to any particular component.

An example of the laser irradiation apparatus is an excimer-laser annealing apparatus that applies laser light to an amorphous silicon film formed over a substrate and thereby forms a polysilicon film over the substrate. Therefore, the laser irradiation apparatus is used to manufacture a TFT (Thin Film Transistor) array substrate in a manufacturing process for a liquid-crystal display panel or an organic EL (Electro Luminescence) display panel. That is, the laser irradiation apparatus is used in a manufacturing process for a semiconductor device such as a TFT array substrate.

[Basic Configuration of Laser Irradiation Apparatus]

Figure 1:
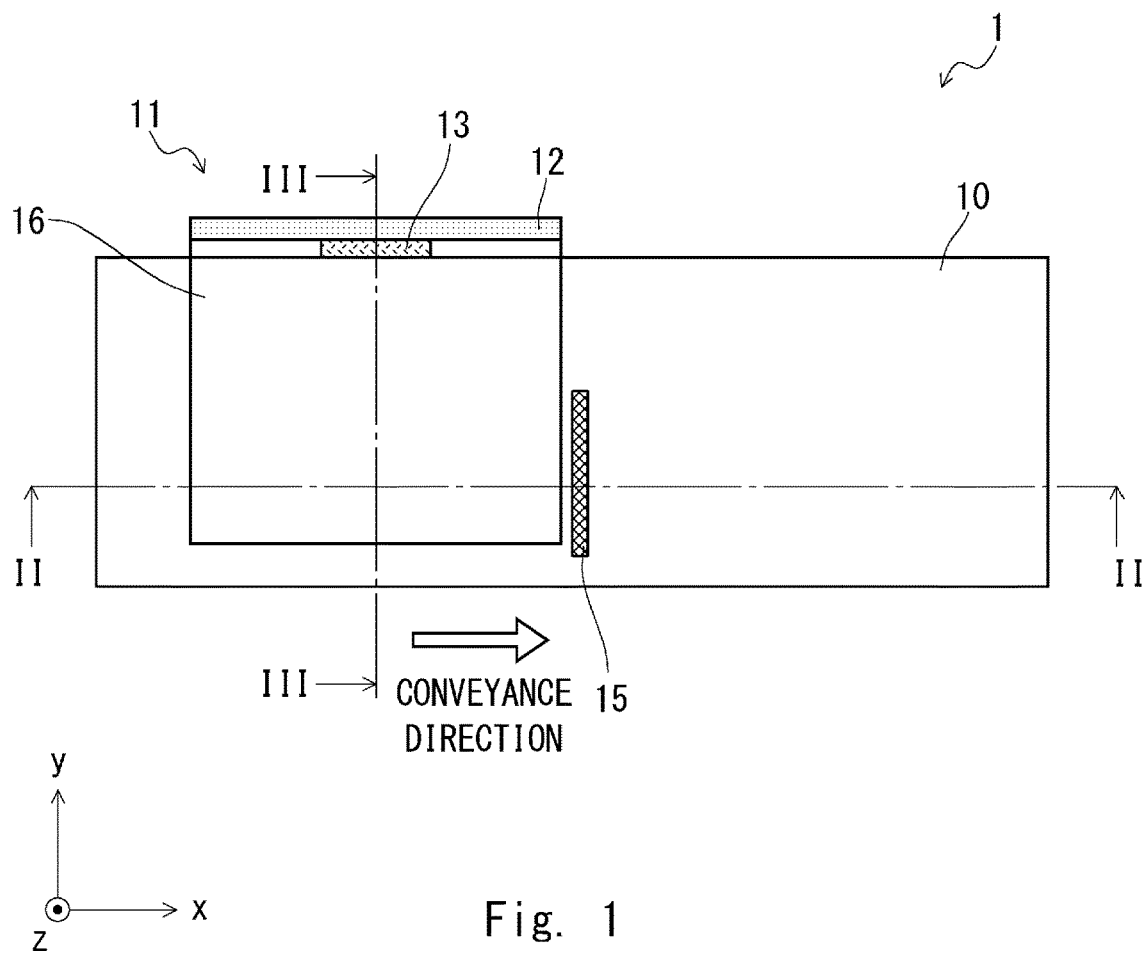
FIG. 1 is a plan view schematically showing a configuration of a laser irradiation apparatus according to a first embodiment.
Figure 2:
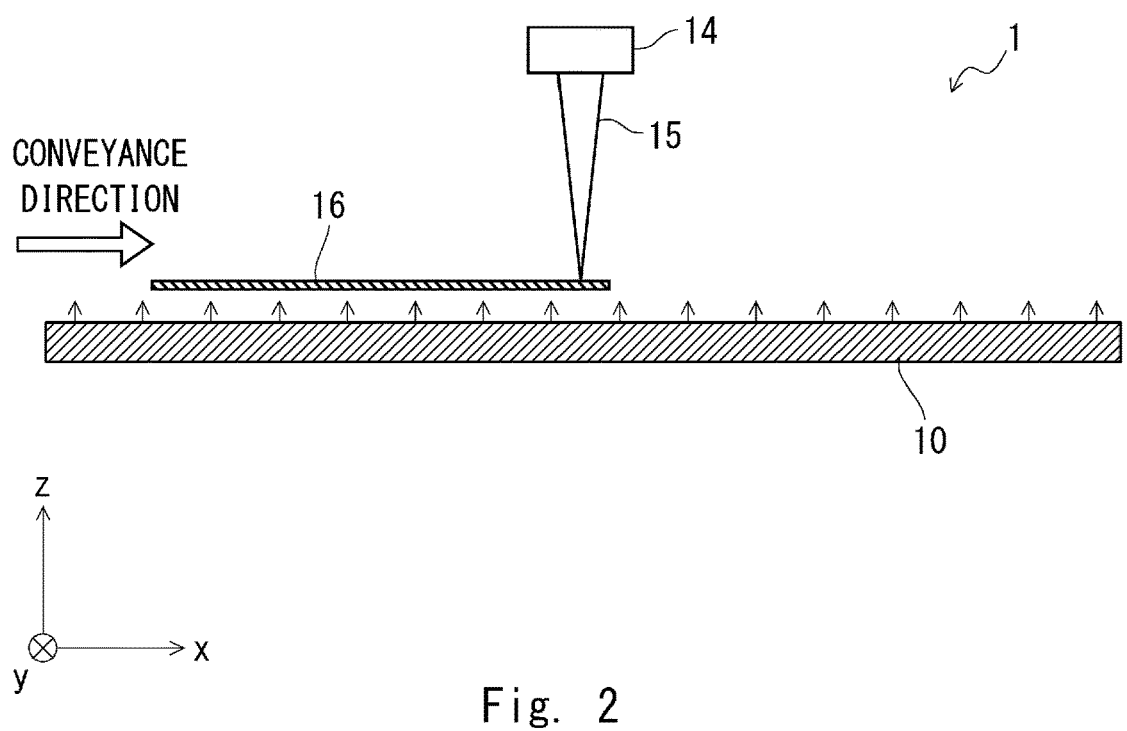
FIG. 2 is a cross section taken along a line II-II in FIG. 1.
Figure 3:
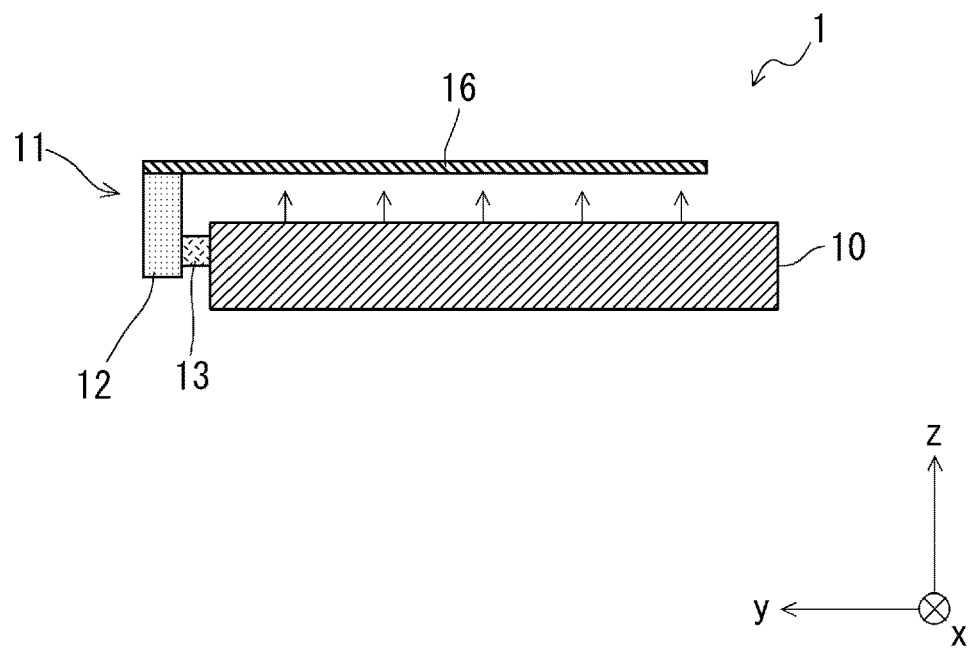
FIG. 3 is a cross section taken along a line in FIG. 1.

A laser irradiation apparatus according to this embodiment is, for example, an ELA (Excimer Laser Anneal) apparatus that forms an LTPS (Low Temperature Poly-Silicon) film. Firstly, a basic configuration of the laser irradiation apparatus is described with reference to FIGS. 1 to 3. FIG. 1 is a plan view for explaining the basic configuration of the laser irradiation apparatus. FIG. 2 is a cross section of the laser irradiation apparatus shown in FIG. 1 taken along a cutting line II-II. FIG. 3 is a cross section of the laser irradiation apparatus shown in FIG. 1 taken along a cutting line III-III.

Note that in the figures described below, an xyz three-dimensional orthogonal coordinate system is shown as appropriate for the sake of simplification of the description. The z-direction is a vertical direction and the y-direction is a direction along a linear laser spot. Further, the x-direction is a conveyance direction. Linear laser light along the y-direction is applied to a substrate while it is being conveyed in the x-direction (i.e., scanning). Further, the x- and y-directions are directions along edges of the rectangular object to be processed 16.

As shown in FIGS. 1 to 3, the laser irradiation apparatus 1 includes a levitation unit 10, a conveyance unit 11, and a laser generation device 14. As shown in FIG. 2, the levitation unit 10 is configured to eject a gas from its surface, and the object to be processed 16 is levitated as the gas ejected from the surface of the levitation unit 10 is blown to the bottom surface of the object to be processed 16. For example, the object to be processed 16 is a glass substrate. When the object to be processed 16 is conveyed, the levitation unit 10 adjusts a levitation height so that the object to be processed 16 does not come into contact with other mechanisms (not shown) disposed above the object to be processed 16.

The conveyance unit 11 conveys the levitated object to be processed 16 in the conveyance direction (the x-direction). As shown in FIG. 1 and FIG. 3, the conveyance unit 11 includes a holding mechanism 12 and a moving mechanism 13. The holding mechanism 12 holds the object to be processed 16. For example, the holding mechanism 12 can be constructed by using a vacuum adsorption mechanism including a porous element. Alternatively, the holding mechanism 12 can be constructed by using a metal member with intake holes formed therein as in the case of a rough levitation unit 113 described later. Further, the holding mechanism 12 may be constructed by using a resin-based material such as PEEK (polyether ether ketone) material. The holding mechanism 12 (the vacuum adsorption mechanism) is connected to an exhaust port (not shown) and the exhaust port is connected to an ejector, a vacuum pump, or the like. Therefore, since a negative pressure for sucking a gas acts on the holding mechanism 12, the object to be processed 16 can be held by using the holding mechanism 12.

Further, the holding mechanism 12 includes a raising/descending mechanism (not shown) for performing an adsorption operation. The raising/descending mechanism includes, for example, an air cylinder or an actuator such as a motor. For example, the holding mechanism 12 adsorbs the object to be processed 16 in a state where the holding mechanism 12 is raised to an adsorbing position. Further, the holding mechanism 12 descends to a standby position in a state where the adsorption is cancelled.

In this embodiment, as shown in FIG. 3, the holding mechanism 12 holds the object to be processed 16 by sucking the surface (the bottom surface) of the object to be processed 16 opposite to the surface (the top surface) thereof to which laser light is applied, i.e., by sucking the surface of the object to be processed 16 that is opposed to the levitation unit 10. Further, the holding mechanism 12 holds an end part of the object to be processed 16 in the +y direction (i.e., an end part in a direction perpendicular to the conveyance direction of the object to be processed 16).

The moving mechanism 13 included in the conveyance unit 11 is connected to the holding mechanism 12. The moving mechanism 13 is configured so that it can move the holding mechanism 12 in the conveyance direction (the x-direction). The conveyance unit 11 (the holding mechanism 12 and the moving mechanism 13) is disposed at an end part of the levitation unit 10 on the y-direction positive side. Further, the object to be processed 16 is conveyed as the moving mechanism 13 moves in the conveyance direction while the holding mechanism 12 is holding the object to be processed 16.

As shown in FIG. 1, for example, the moving mechanism 13 is configured to slide the end part of the levitation unit 10 in the +y direction along the +x direction. Therefore, the object to be processed 16 is conveyed along the x-direction as the moving mechanism 13 slides the end part of the levitation unit 10 along the +x direction. Note that the conveyance speed of the object to be processed 16 can be controlled by controlling the moving speed of the moving mechanism 13. The moving mechanism 13 includes, for example, an actuator such as a motor, a liner guide mechanism, an air bearing, etc. (not shown).

As shown in FIGS. 1 and 2, laser light 15 (hereinafter, a laser-light irradiation place is also indicated by the reference numeral 15) is applied to the object to be processed 16. For example, the laser irradiation apparatus is a laser annealing apparatus. In this case, an excimer laser or the like can be used for the laser generation device 14. Laser light emitted from the laser generation device 14 becomes linear in an optical system including a cylindrical lens (not shown). The object to be processed 16 is irradiated with the linear laser light 15, specifically, laser light 15 having a focal point extending in the y-direction (i.e., a line beam) (see, FIG. 1). In other words, the irradiation place of the laser light 15 over the object to be processed 16 extends in a direction perpendicular to the conveyance direction (the x-direction) of the object to be processed 16 (i.e., extends in the y-direction).

The object to be processed 16 is, for example, a glass substrate in which an amorphous film (an amorphous silicon film) is formed. The amorphous film can be crystallized by irradiating the amorphous film with laser light 15 and performing an annealing process. For example, the amorphous silicon film can be converted into a polycrystalline silicon film (a polysilicon film).

The laser irradiation apparatus 1 shown in FIGS. 1 to 3 conveys the object to be processed 16 in the conveyance direction by holding the bottom surface of the object to be processed 16 using the conveyance unit 11 and while levitating the object to be processed 16 using the levitation unit 10. Note that when the object to be processed 16 is conveyed, the conveyance unit 11 included in the laser irradiation apparatus 1 conveys the object to be processed 16 while the conveyance unit 11 is holding a part of the object to be processed 16 that does not overlap the laser irradiation place 15 in a plan view (i.e., as viewed in the z-direction). That is, as shown in FIG. 1, when the object to be processed 16 is conveyed in the conveyance direction, the part of the object to be processed 16 at which the conveyance unit 11 holds the object to be processed 16 (which corresponds to the position of the holding mechanism 12) does not overlap the laser irradiation place 15.

For example, a planar shape of the object to be processed 16 is a quadrangle (a rectangular) having four sides and the conveyance unit 11 (the holding mechanism 12) holds only one of the four sides of the object to be processed 16. Further, the conveyance unit 11 (the holding mechanism 12) holds a part of the object to be processed 16 that is not irradiated with laser light in a period during which the object to be processed 16 is being conveyed.

By the above-described configuration, it is possible to position the part of the object to be processed 16 at which the conveyance unit 11 holds the object to be processed 16 (which corresponds to the position of the holding mechanism 12) and the laser irradiation place 15 away from each other. The laser irradiation place 15 is located roughly in a half of the object to be processed 16 on the Y-axis negative side and the conveyance unit 11 holds the end thereof on the Y-axis positive side. It is possible to increase the distance between the place near the holding mechanism 12 where warping is large and the laser irradiation place 15. Therefore, it is possible to reduce the effect of the warping of the object to be processed 16 caused by the holding mechanism 12 when laser light is applied to the object to be processed 16.

In the y-direction, the length of the laser irradiation place 15 is about half the length of the object to be processed 16. Therefore, when the object to be processed 16 passes the laser irradiation place 15 once, the amorphous silicon film in substantially a half of the area of the object to be processed 16 is crystallized. Then, after the object to be processed 16 is rotated about the Z-axis by 180 degrees by a rotation mechanism (not shown), the conveyance unit 11 conveys the object to be processed 16 in the X-axis negative direction. Alternatively, after the rotated object to be processed 16 is conveyed in the X-axis negative direction, the conveyance unit 11 may convey the object to be processed 16 again in the X-axis positive direction. Then, when the object to be processed 16 is conveyed in the X-axis negative direction or when the object to be processed 16 is conveyed in the X-axis positive direction again after the rotation of 180 degrees, laser light is applied to the object to be processed 16. In this way, the object to be processed 16 passes through the laser irradiation place 15 and the amorphous silicon film in the remaining half of the object to be processed 16 is crystallized. By making the object to be processed 16 perform a reciprocating motion as described above, the amorphous silicon film is converted into a polycrystalline silicon film over the substantially entire area of the object to be processed 16.

[Levitation Unit 10]

Figure 4:
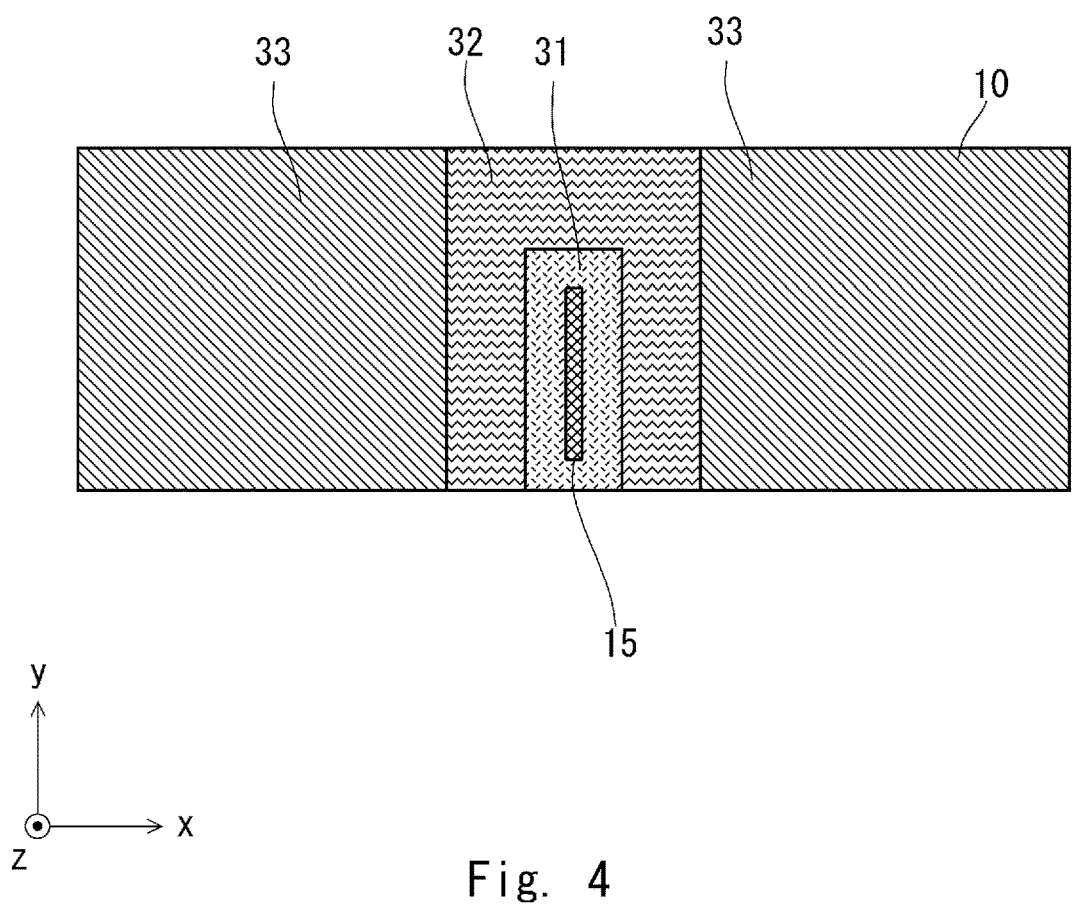
FIG. 4 is a plan view schematically showing a configuration of a levitation unit.

Next, a configuration of the levitation unit 10 will be described with reference to FIG. 4. FIG. 4 is an xy-plane view showing a configuration of the levitation unit 10. The levitation unit 10 includes a precision levitation area 31, a semi-precision levitation area 32, and a rough levitation area 33.

The precision levitation area 31 is an area including the laser irradiation place 15. That is, in the xy-plane view, the precision levitation area 31 is an area that overlaps the focal point of laser light (the laser irradiation place 15). The precision levitation area 31 is a rectangular area larger than the laser irradiation place 15.

The semi-precision levitation area 32 is an area adjoining the precision levitation area 31. In the x-direction, the semi-precision levitation area 32 is disposed on both sides of the precision levitation area 31. Further, the semi-precision levitation area 32 is also disposed on the y-axis positive side of the precision levitation area 31. The semi-precision levitation area 32 is formed in a U-shape so as to adjoin the three sides of the rectangular precision levitation area 31. The semi-precision levitation area 32 is larger than the precision levitation area 31.

The rough levitation area 33 is an area adjoining the semi-precision levitation area 32. That is, the semi-precision levitation area 32 is disposed between the rough levitation area 33 and the precision levitation area 31. In the X-direction, the rough levitation area 33 is disposed on both sides of the precision levitation area 31. That is, separated rough levitation areas 33 are disposed on the x-axis positive side and the x-axis negative side, respectively, of the semi-precision levitation area 32. In the xy-plane view, the semi-precision levitation area 32 and the rough levitation area 33 are areas that do not overlap the focal point of laser light (the laser irradiation place 15).

Figure 5:
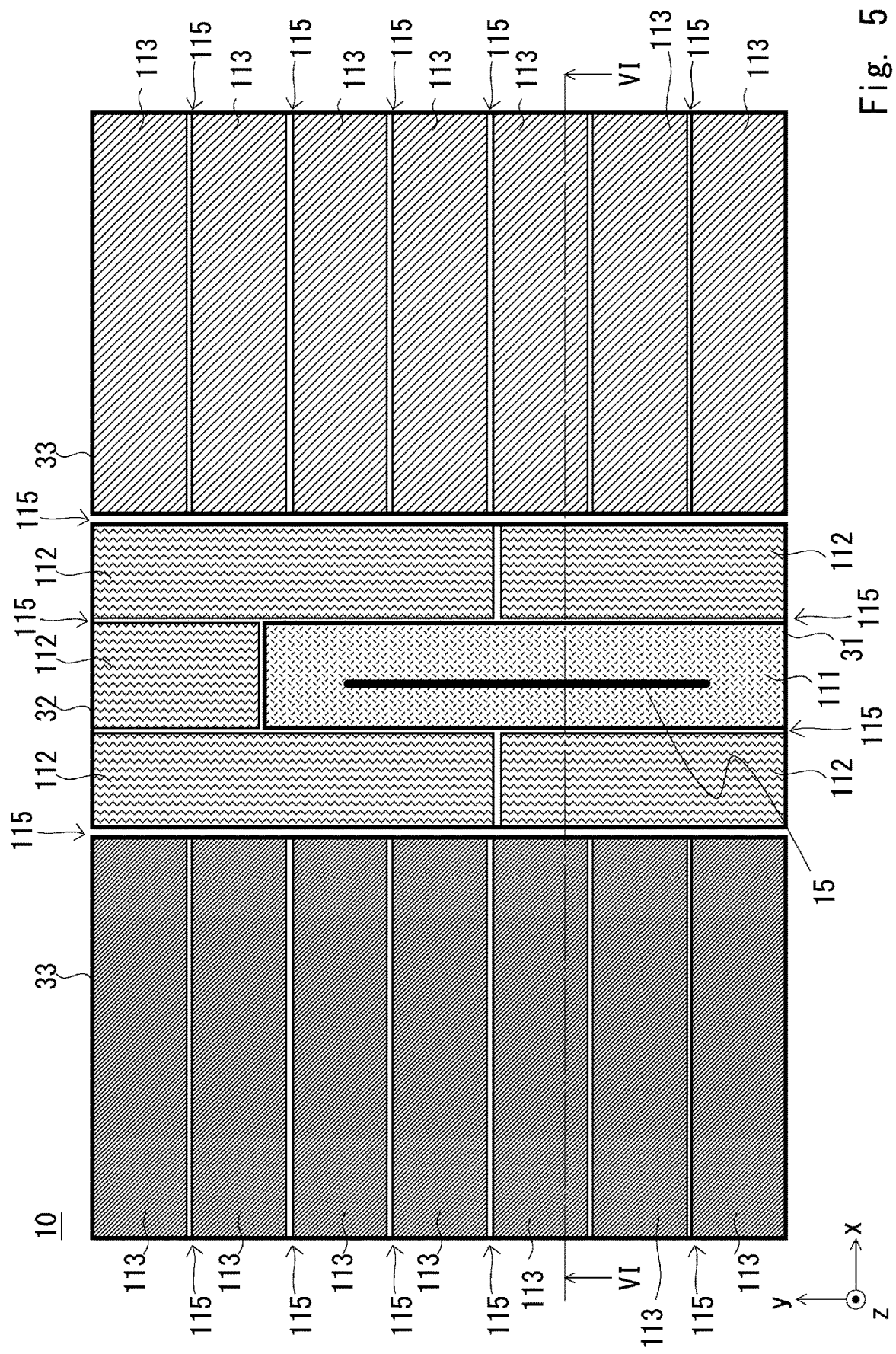
FIG. 5 is a plan view for explaining each area of the levitation unit.
Figure 6:
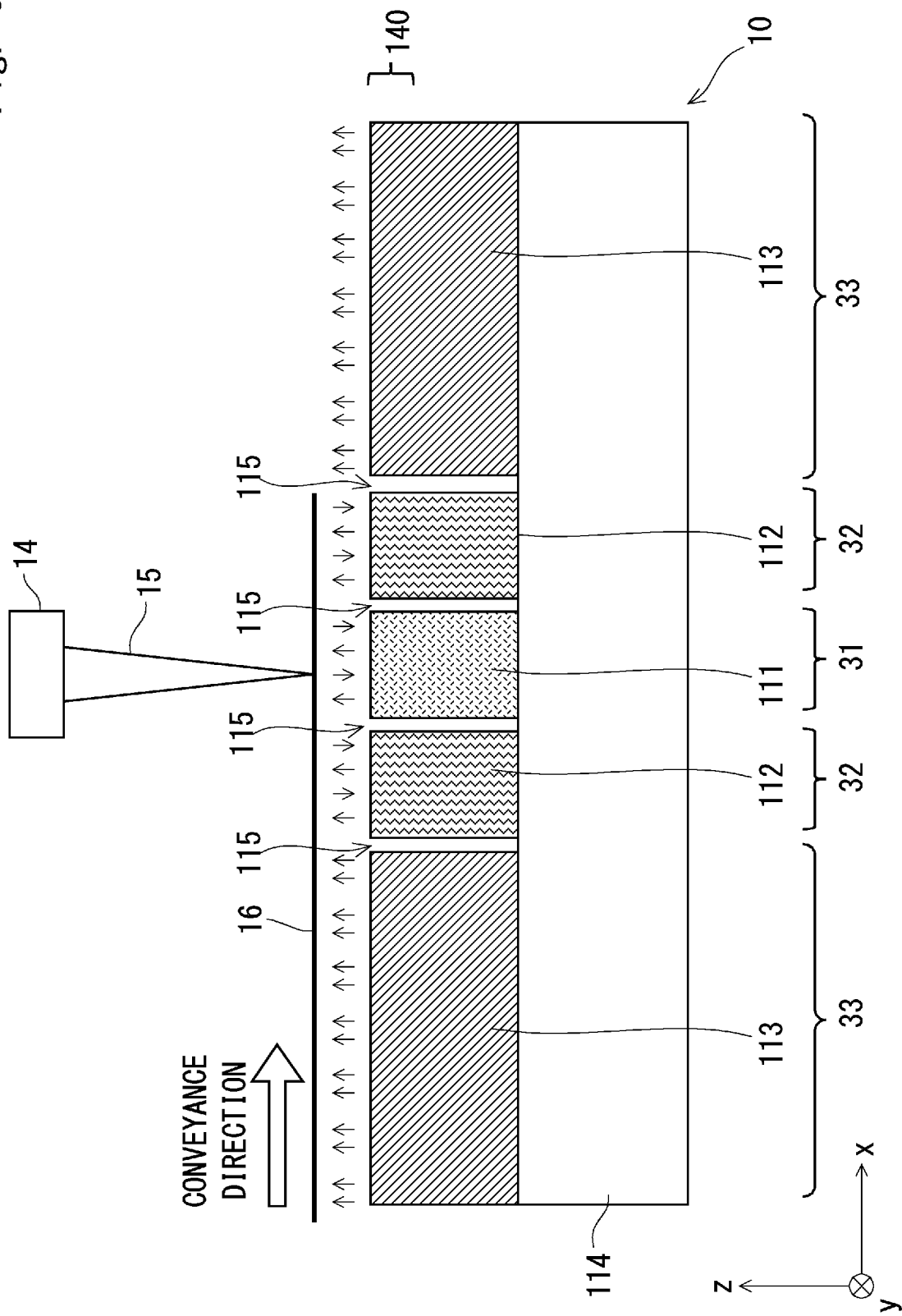
FIG. 6 is a cross section taken along a line VI-VI in FIG. 5.

Next, an arrangement of blocks in each area will be described with reference to FIGS. 5 and 6. FIG. 5 is a plan view schematically showing a configuration of a part of the levitation unit 10. Further, FIG. 6 is a cross section taken along a line VI-VI in FIG. 5. Note that FIGS. 5 and 6 show the configuration of a part of the levitation unit 10 at and around the laser irradiation place 15. Specifically, parts of the rough levitation area 33 located in the ends in the x-direction are omitted in the drawings.

A precision levitation unit 111 is provided in the precision levitation area 31. In the xy-plane view, the precision levitation unit 111 overlaps the laser irradiation place 15. In the xy-plane view, the precision levitation unit 111 has a rectangular shape whose longitudinal direction is in the y-direction. Note that in the drawing, although the precision levitation area 31 is formed by one precision levitation unit 111, the precision levitation area 31 may be formed by two or more precision levitation units 111.

A plurality of semi-precision levitation units 112 are provided in the semi-precision levitation area 32. In the x-direction, the semi-precision levitation units 112 are disposed on both sides of the precision levitation units 111. In this example, the semi-precision levitation area 32 having the U-shape is formed by five semi-precision levitation units 112. In the xy-plane view, each of the semi-precision levitation units 112 has a rectangular shape whose longitudinal direction is in the y-direction. In FIG. 5, the semi-precision levitation units 112 have different sizes. All the semi-precision levitation units 112 may have the same size, or some or all of them may have different sizes.

A plurality of rough levitation units 113 are provided in the rough levitation area 33. The rough levitation units 113 are provided on both sides of the semi-precision levitation area 32 in the x-direction. In the xy-plane view, each of the rough levitation units 113 has a rectangular shape whose longitudinal direction is in the x-direction. In FIG. 5, all the rough levitation units 113 have the same size. Some or all of the rough levitation units 113 may have different sizes.

Note that as shown in FIG. 6, at a place in the Y-direction included in the laser irradiation place 15, a rough levitation unit 113, a semi-precision levitation unit 112, a precise levitation unit 111, another semi-precision levitation unit 112, and another rough levitation unit 113 are arranged in this order in the direction from the x-axis negative side toward the x-axis positive side. From the x-axis negative side, an object to be processed 16 passes through the rough levitation unit 113, the semi-precision levitation unit 112, the precision levitation unit 111, the semi-precision levitation unit 112, and the rough levitation unit 113 in this order.

As shown in FIG. 6, each of the precision levitation unit 111, the semi-precision levitation units 112, and the rough levitation units 113 ejects gas (e.g., air) upward. When gas is blown onto the bottom surface of the object to be processed 16, the object to be processed 16 is levitated. Therefore, the levitation unit 10 and the object to be processed 16 are brought into a non-contact state. Further, the precision levitation unit 111 and the semi-precision levitation units 112 suck gas present between the object to be processed 16 and the levitation unit 10. Each of the rough levitation units 113 is configured to be able to suck gas in the same manner as the semi-precision levitation units 112.

A gas supply source for supplying gas (not shown), for example, is connected to the precision levitation unit 111, the semi-precision levitation units 112, and the rough levitation units 113. Further, a vacuum source for sucking gas (not shown) is connected to the precision levitation unit 111, the semi-precision levitation units 112, and the rough levitation units 113. The gas supply source is, for example, a compressor or a gas cylinder, and supplies compressed gas. The vacuum source is, for example, a vacuum pump or an ejector.

The accuracy of the height of the levitation by the precision levitation unit 111 is higher than those of the semi-precision levitation units 112 and the rough levitation units 113. The accuracy of the height of the levitation by the semi-precision levitation units 112 is higher than that of the rough levitation units 113. Further, laser light is applied to the object to be processed 16 in the precision levitation area 31 where the accuracy of the levitation height is the highest. For example, the semi-precision levitation unit 112 is configured to levitate the object to be processed 16 with accuracy that is lower than the accuracy at the time when the precision levitation unit 111 levitates the object to be processed 16 and is higher than the accuracy at the time when the rough levitation unit 113 levitates the object to be processed 16.

The precision levitation unit 111, the semi-precision levitation units 112, and the rough levitation units 113 are attached to a base unit 114. The base unit 114 is, for example, a metal plate made of aluminum. The precision levitation unit 111, the semi-precision levitation units 112, and the rough levitation units 113 are fixed to the base unit 114 by, for example, bolts or the like. The top surfaces of the precision levitation unit 111, the semi-precision levitation units 112, and the rough levitation units 113 are substantially at the same height. That is, the top surface (the levitation surface) of the levitation unit 10 is substantially flat. Note that a plate for adjusting the height may be provided between each unit and the base unit 114. Further, an internal space (not shown) that serves as a flow path(s) for ejecting or sucking gas may be formed inside the base unit 114.

A groove 115 is formed between each two adjacent units (the precision levitation unit 111, the semi-precision levitation units 112, and rough levitation units 113). Each groove 115 extends along the x-direction or the y-direction and reaches the outer peripheral surface of the levitation unit 10. For example, a groove 115 extending in the y-direction is disposed between the precision levitation unit 111 and a semi-precision levitation unit 112 adjacent to each other. Similarly, a groove 115 extending in the y-direction is disposed between the semi-precision levitation unit 112 and a rough levitation unit 113 adjacent to each other. Further, a groove 115 extending in the x-direction or the y-direction is disposed between each two adjacent semi-precision levitation units 112. Similarly, a groove 115 extending in the x-direction is disposed between each two adjacent rough levitation units 113.

Each two adjacent units are spaced apart by the width of the groove 115. In other words, a space corresponding to the width of the groove 115 is provided between each two adjacent units. The width of the groove 115 is, for example, about 10 mm. Needless to say, the width of the groove 115 is not limited to 10 mm. The width of the groove 115 is smaller than the width of each unit.

Here, as shown in FIG. 6, the surface (the top surface) of the levitation unit 10 and the vicinity thereof are referred to as a surface part 140. In the precision levitation area 31, the precision levitation unit 111 is disposed in the surface part 140 of the levitation unit 10. In the semi-precision levitation area 32, semi-precision levitation units 112 are disposed in the surface part 140 of the levitation unit 10. In the rough levitation area 33, rough levitation units 113 are disposed in the surface part 140 of the levitation unit 10. Note that the surface part 140 is a part that is slightly thicker than the thickness of surface treatment performed on the semi-precision levitation units 112 and the rough levitation units 113. The surface treatment of the semi-precision levitation units 112 and the rough levitation units 113 will be described later.

The precision levitation unit 111 includes a porous element. Specifically, the porous element is disposed in the surface part 140 of the precision levitation unit 111. Each of the semi-precision levitation units 112 and the rough levitation units 113 includes a metal member. Specifically, a metal member is disposed in the surface part 140 of each of the semi-precision levitation units 112 and the rough levitation units 113.

The semi-precision levitation units 112 and the rough levitation units 113 have configurations similar to each other. The configuration of each of the precision levitation unit 111 and the rough levitation unit 113 will be described hereinafter.

[Rough Levitation Unit 113]

Figure 7:
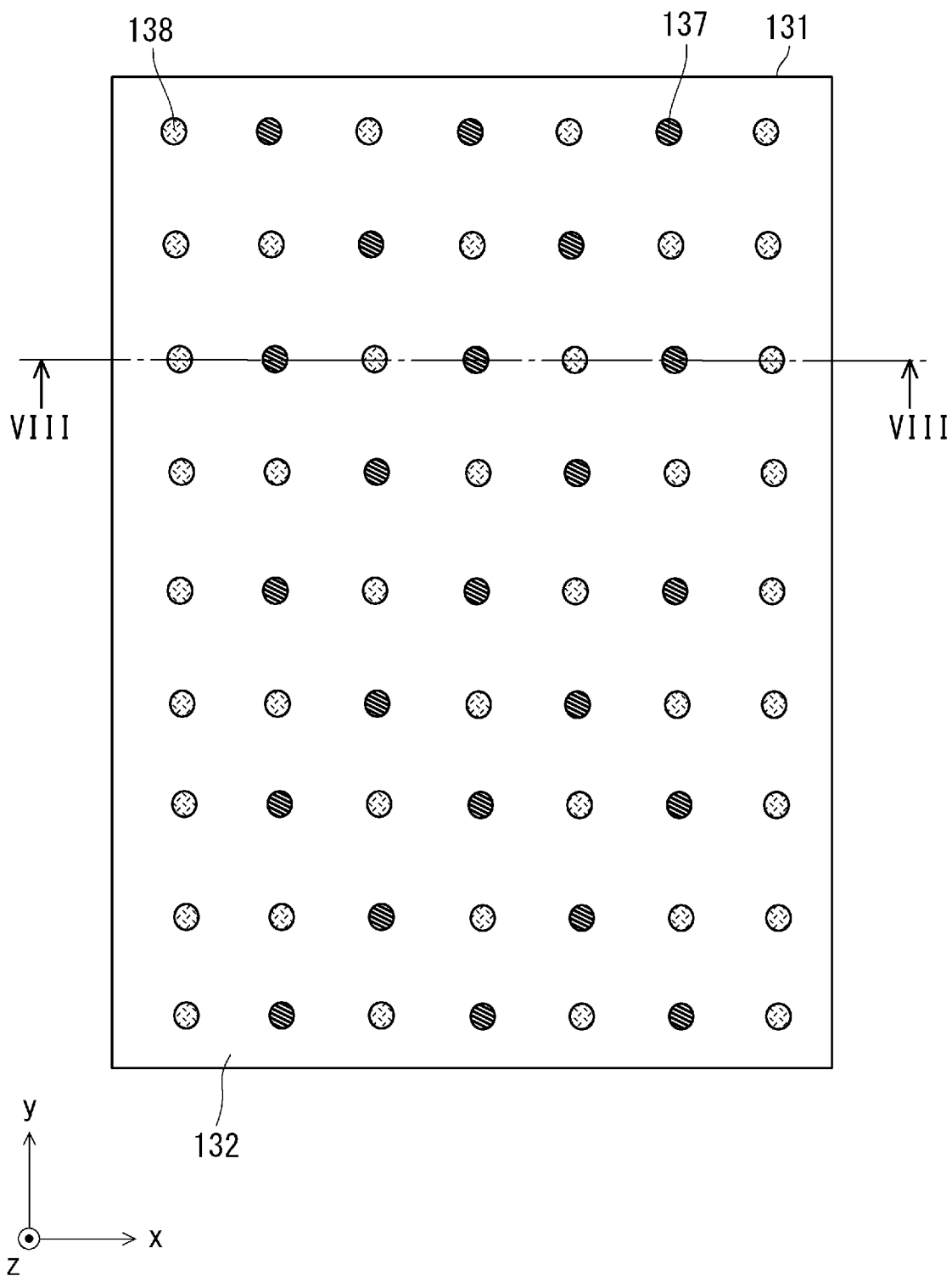
FIG. 7 is a plan view showing a configuration of a rough levitation unit.
Figure 8:
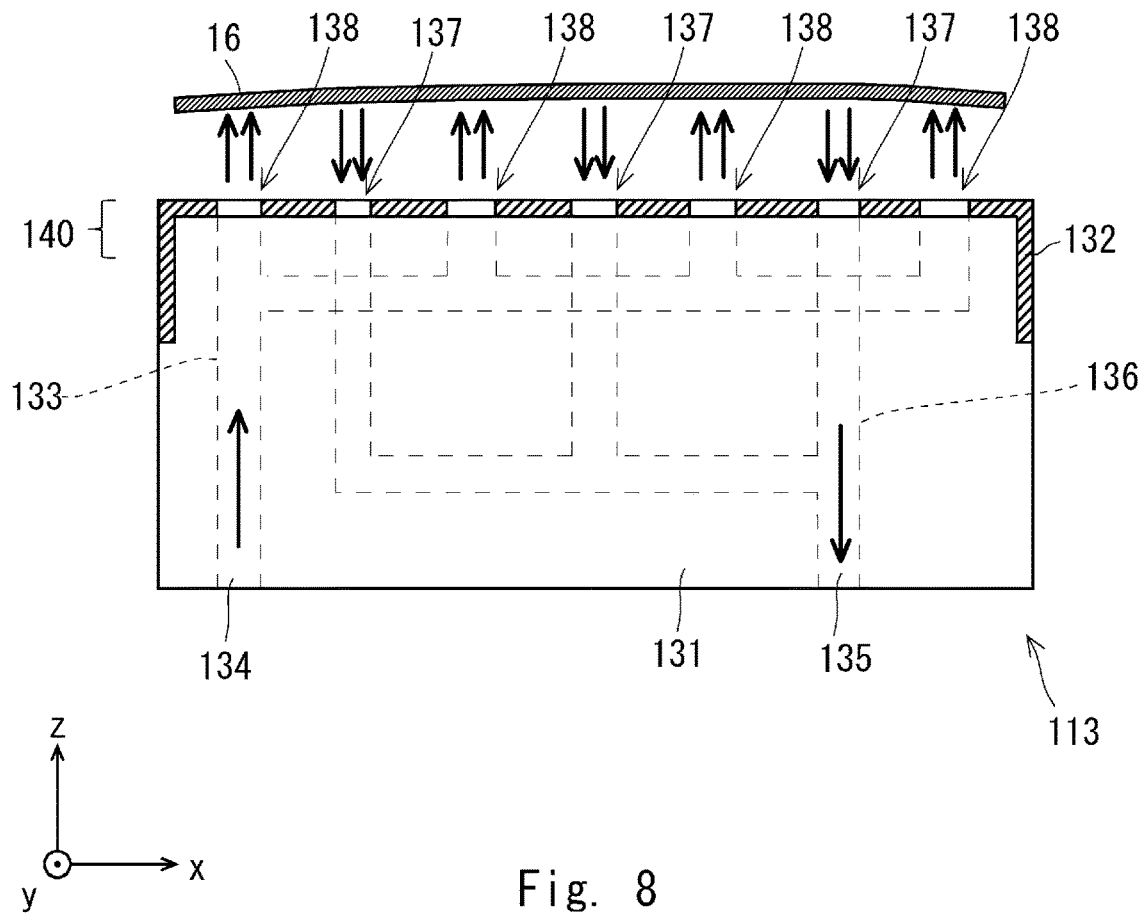
FIG. 8 is a cross section taken along a line VIII-VIII in FIG. 7.

Firstly, a configuration of the rough levitation unit 113 will be described with reference to FIGS. 7 and 8. FIG. 7 is a plan view schematically showing the configuration of the rough levitation units 113. FIG. 8 is a cross section taken along a line VIII-VIII in FIG. 7. Note that since the configuration of the semi-precision levitation unit 112 is similar to that of the rough levitation unit 113, its detailed description is omitted.

The rough levitation unit 113 includes a metal member 131. The metal member 131 is formed of, for example, a metal block made of aluminum or stainless steel (SUS). A plurality of intake holes 137 and a plurality of ejection holes 138 are formed in the metal member 131. By machining the metal member 131, the plurality of intake holes 137 and the plurality of ejection holes 138 are formed in the surface part 140 of the metal member 131. Each of the intake holes 137 and the ejection holes 138 is a through-hole (a space) having a predetermined diameter and extending in the z-direction. In the xy-plane view, each of the intake holes 137 and the ejection holes 138 has, for example, a circular shape having a diameter of several millimeters.

In the xy plane view, the intake holes 137 and the ejection holes 138 are arranged at predetermined intervals. In this example, the intake holes 137 and the exhaust holes 138 are arranged in a grid pattern along the x-direction and the y-direction. The intake holes 137 are openings through which gas can be sucked and function as a gas sucking part. The ejection holes 138 are openings through which gas can be ejected and function as gas ejecting part.

As shown in FIG. 8, a supply flow path 133, a supply port 134, an intake port 135, and an intake flow path 136 are formed in the metal member 131. The supply port 134 and the intake port 135 are disposed on the bottom surface side (the z-axis negative side) of the metal member 131 and connected to, for example, the internal space of the base unit 114. The supply flow path 133 and the intake flow path 136 are formed inside the metal member 131 so as to extend from the bottom surface of the metal member 131 to the top surface thereof. As described above, spaces that serve as gas flow paths are formed inside the metal member 131.

The intake port 135 is connected to a vacuum source such as a vacuum pump. The intake port 135 is connected to the intake holes 137 through the intake flow path 136. In this example, the intake flow path 136 is divided into a plurality of branches inside the metal member 131. Therefore, one intake port 135 communicates with a plurality of intake holes 137. The intake flow path 136 becomes a negative-pressure space by the vacuum source. It is possible to sack gas present between the metal member 131 and the object to be processed 16 through the intake holes 137.

The supply port 134 is connected to a gas supply source such as a gas cylinder. The supply port 134 is connected to the ejection holes 138 through the supply flow path 133. In this example, the supply flow path 133 is divided into a plurality of branches inside the metal member 131. Therefore, one supply port 134 communicates with a plurality of ejection holes 138. The supply flow path 133 becomes a positive-pressure space by the gas supply source. It is possible to eject gas from the ejection holes 138 to the object to be processed 16.

The intake flow path 136, which becomes a negative-pressure space, and the supply flow path 133, which becomes a positive-pressure space, are separated from each other. That is, airtightness is maintained between the negative-pressure space and the positive-pressure space.

Further, as shown in FIG. 8, a surface treatment part 132 is provided in the metal member 131. The surface treatment part 132 is formed over the top surface (the levitation surface) of the metal member 131. Further, the surface treatment part 132 is also formed over the top surface side of the side surface of the metal member 131. The surface treatment part 132 is formed by performing antistatic treatment on a part of the side surface and the top surface of the metal member 131. Raydent treatment (Registered Trademark) and/or alumite treatment is performed on the surface treatment part 132 of the metal member 131. An antistatic coating is provided over the top surface of the surface treatment part 132.

In the rough levitation area 33, the metal member 131 including the surface treatment part 140 constitutes the surface part 132 of the levitation unit 10. That is, the surface part 140 of the rough levitation units 113 is formed by the surface treatment part 132 and the metal member 131. The surface part 140 is a part that is thicker than the thickness of the surface treatment part 132 disposed over the top surface of the metal member 131.

The surface part 140 of the rough levitation unit 113 is made of a non-porous dense material. That is, the metal member 131, which is not porous, is provided in the surface part 140 of the rough levitation unit 113. By using the metal member 131, which is a non-porous material, for the surface part 140 as described above, it is possible to suppress the generation of particles. For example, even if the object to be processed 16 comes into contact with the rough levitation units 113, the generation of particles can be suppressed. Since substantially the whole levitation unit 10 except for the precision levitation area 31 is made of a metal material, which is a non-porous material, it is possible to reduce the amount of particles generated from the porous element.

Figure 9:
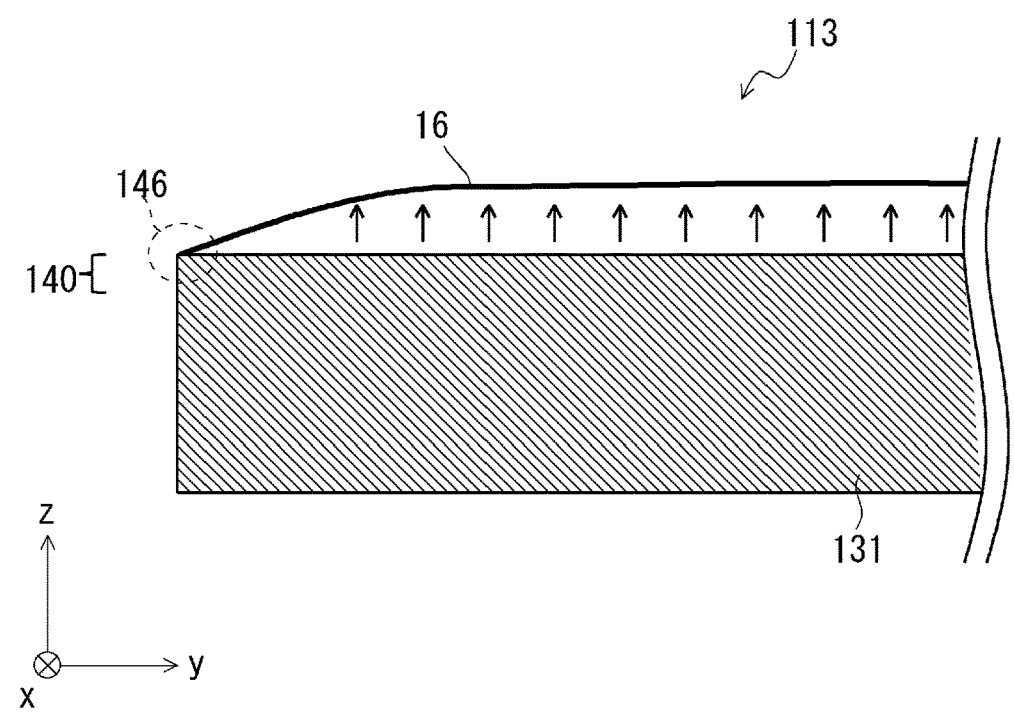
FIG. 9 schematically shows a state in which an object to be processed is in contact with a rough levitation unit.

When the levitation height of the object to be processed 16 is insufficient or when the amount of warping of the object to be processed 16 is large, there is a possibility that an end of the object to be processed 16 comes into contact with the rough levitation unit 113 as shown in FIG. 9 and hence the rough levitation unit 113 is damaged (see a damaged part 146 in FIG. 9). If the surface part 140 of the rough levitation units 113 is formed of a porous material as in the case of the later-described precision levitation unit 111, particles are generated in the damaged part 146 of the rough levitation unit 113.

As described in this embodiment, the surface part 140 of each of the rough levitation units 113 and the semi-precision levitation units 112 is formed of the metal member 131. In this way, no porous element is exposed on the top surface (the levitation surface) of the levitation unit 10 in the semi-precision levitation area 33 and the rough levitation area 32. Therefore, it is possible to suppress the generation of particles which would otherwise be caused by damage in the porous element.

Further, a plurality of ejection holes 138 are formed in the metal member 131. Gas is ejected from the ejection holes 138 toward the object to be processed 16. Therefore, the object to be processed 16 is levitated over the levitation unit 10. The levitation height can be adjusted by controlling the amount of supplied gas.

Figure 10:
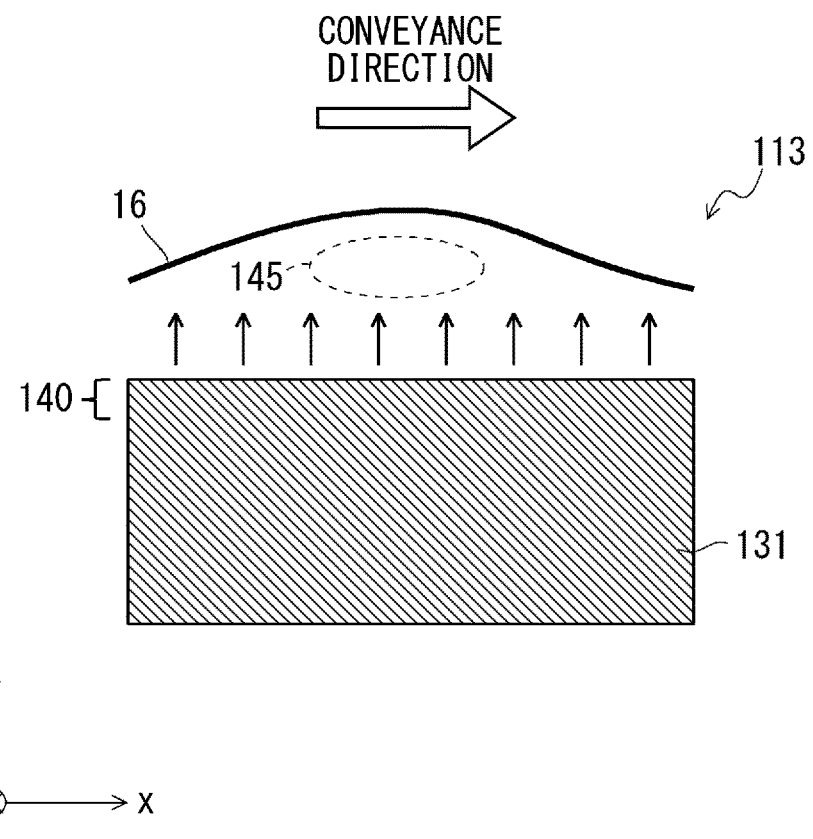
FIG. 10 is a cross section for explaining a gas accumulation formed between an object to be processed and a rough levitation unit.

Further, intake holes 137 through which gas can be sucked are formed in the metal member 131. It is possible to make the object to be processed 16 flat by sucking gas through the intake holes 137. For example, in the case where gas is not sucked from the intake holes 137, when gas ejected from the ejection holes 138 is blown onto the bottom surface of the object to be processed 16 and hence the object to be processed 16 is levitated, a gas accumulation 145 is formed between the object to be processed 16 and the rough levitation unit 113 as shown in FIG. 10. This gas accumulation 145 causes the object to be processed 16 to be warped.

Due to the gas accumulation 145, the following phenomena may occur. That is, only the central part of the object to be processed 16 may be levitated and the corners of the object to be processed 16 may be significantly warped. Further, in some cases, the corners of the object to be processed 16 collide with the rough levitation unit 113. The above-described phenomena occur more frequently as the size of the object to be processed 16 increases and/or as the thickness of the object to be processed 16 decreases.

It is possible to reduce the warping of the object to be processed 16 by sucking gas (the gas accumulation 145) present between the object to be processed 16 and the rough levitation unit 113 through the intake holes 137. In other words, it is possible to make the object to be processed 16 flat. It is possible to control the amount of the warping of the object to be processed 16 by adjusting the balance between the amount of gas supplied to the supply port 134 and the amount of gas exhausted from the intake port 135.

When the levitation height is sufficient and hence the object to be processed 16 does not come into contact with the levitation unit 10, some of the units may be configured so that no gas is sucked through the intake holes 137. For example, the rough levitation units 113 may be configured so that no gas is sucked through the intake holes 137. A valve disposed between the vacuum source and the intake port 135 is closed, so that the vacuum source is not connected to the intake holes 137. As a result, gas can be just ejected without being sucked in the rough levitation units 113.

In the case where no gas is sucked, the rough levitation units 113 may include no intake hole 137. That is, rough levitation units 113 with no intake hole 137 formed therein may be provided in the rough levitation area 33.

In the example according to this embodiment, gas is sucked in the semi-precision levitation units 112 and no gas is sucked in the rough levitation units 113. In other words, among the units each having the configuration shown in FIGS. 7 and 8, those in which gas is sucked are the semi-precision levitation units 112 and those in which no gas is sucked are the rough levitation units 113.

The semi-precision levitation unit 112 is configured so that the amount of the warping of the object to be processed 16 gradually changes when the object to be processed 16 is conveyed from the rough levitation unit 113 to the precision levitation unit 111 or when the object to be processed 16 is conveyed from the precision levitation unit 111 to the rough levitation unit 113. In other words, the semi-precision levitation unit 112 conveys the object to be processed 16 so as to absorb the difference between the amount of the warping of the object to be processed 16 in the precision levitation unit 111 and that of the object to be processed 16 in the rough levitation units 113.

Therefore, it is possible to suppress the influence on the laser irradiation due to the warping of the object to be processed 16 that is caused when the object to be processed 16 moves between the different areas. In other words, since the distance between the place where the warping of the object to be processed 16 is large and the laser irradiation place 15 can be increased by providing the semi-precision levitation units 112, the warping of the object to be processed 16 in the laser irradiation place 15 can be reduced as compared to the configuration in which no semi-precision levitation unit 112 is provided.

In this manner, the semi-precision levitation unit 112 is configured to levitate the object to be processed 16 with accuracy that is lower than the accuracy at the time when the precision levitation unit 111 levitates the object to be processed 16 and is higher than the accuracy at the time when the rough levitation unit 113 levitates the object to be processed 16. It is possible to prevent the object to be processed 16 from being displaced from the depth of field (DOF) of the laser light in the laser irradiation place 15. Therefore, it is possible to reduce the uneven irradiation of the laser light and thereby to form a uniform polysilicon film.

Note that in the above descriptions, while gas is ejected and sucked in the semi-precision levitation units 112, gas is just ejected without being sucked in the rough levitation units 113. However, gas may be ejected and sucked in both the semi-precision levitation units 112 and the rough levitation units 113. Alternatively, gas may be just ejected without being sucked in both the semi-precision levitation units 112 and the rough levitation units 113. The amount of gas to be sucked and the amount of gas to be ejected may be adjusted for each unit or each area.

Further, in this embodiment, a groove 115 is formed between each two adjacent units as shown in FIGS. 5 and 6. The groove 115 extends along the x-direction or the y-direction and reaches the outer peripheral surface of the levitation unit 10. The width of the groove 115 is smaller than the width of each unit (e.g., the width of the rough levitation unit 113). The width of the groove 115 is, for example, about 10 mm and its height (depth) is about 20 mm. The groove 115 discharges gas present between the object to be processed 16 and the top surface of the rough levitation units 113.

In the case where no groove 115 is formed between adjacent units, when gas ejected through the ejection holes 138 is blown onto the bottom surface of the object to be processed 16 and hence the object to be processed 16 is levitated, a gas accumulation 145 is formed between the object to be processed 16 and the rough levitation unit 113 (see FIG. 10). The gas accumulation 145 causes the object to be processed 16 to be warped.

Figure 11:
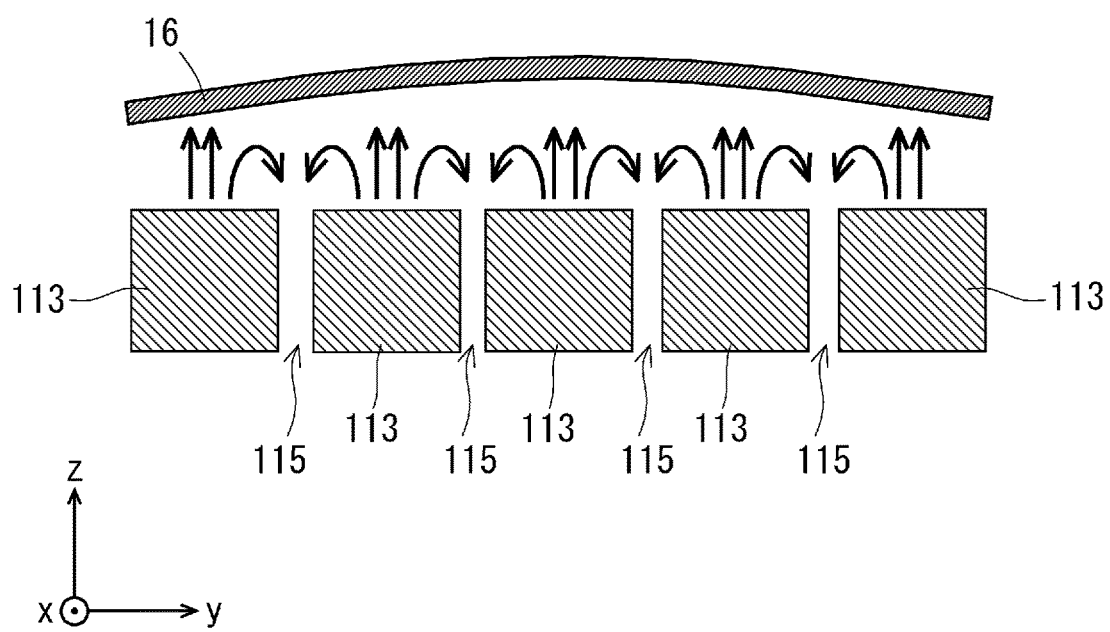
FIG. 11 is a schematic diagram showing a state in which gas is discharged from gaps between rough levitation units.

In contrast to this, in this embodiment, a groove 115 is provided between each two adjacent rough levitation units 113 as shown in FIG. 11. Gas present between the object to be processed 16 and the rough levitation units 113 is discharged to the outside of the levitation unit 10 through the grooves 115. Therefore, it is possible to prevent the object to be processed 16 from being warped when the object to be processed 16 passes over the rough levitation units 113.

Further, a groove 115 is also formed between a semi-precision levitation unit 112 and a rough levitation unit 113 adjacent to each other, between adjacent two semi-precision levitation units 112, and between the precision levitation unit 111 and a semi-precision levitation unit 112 adjacent to each other. In this way, it is possible to increase the amount of discharged gas and thereby to prevent the gas accumulation 145 from being formed. It is possible to reduce the warping of the object to be processed 16.

As described above, the metal members 131 are provided in the surface parts 140 of the semi-precision levitation area 32 and the rough levitation area 33. The surface part 140 of the rough levitation area 33 is formed by disposing a plurality of metal members 131. The surface part 140 of the semi-precision levitation area 32 is formed by disposing a plurality of metal members 131. Note that the amount of ejected gas and the amount of sucked gas may be set as appropriate according to, for example, the arrangement of the intake holes 137 and the arrangement of the ejection holes 138 in each unit. Note that the grooves for discharging gas may also be formed in the surfaces of the semi-precision levitation units 112 and/or the rough levitation units 113.

[Precision Levitation Unit 111]

The precision levitation unit 111 is a unit that accurately levitates and conveys the object to be processed 16 and is configured so as to be able to convey the object to be processed 16 while reducing the amount of the warping thereof during the conveyance. The precision levitation unit 111 accurately controls the amount of gas that is ejected in order to levitate the object to be processed 16. The precision levitation unit 111 is configured to levitate the object to be processed 16 by ejecting and sucking gas. Here, a detailed configuration of the precision levitation unit 111 will be described with reference to FIGS. 12 and 13.

Figure 12:
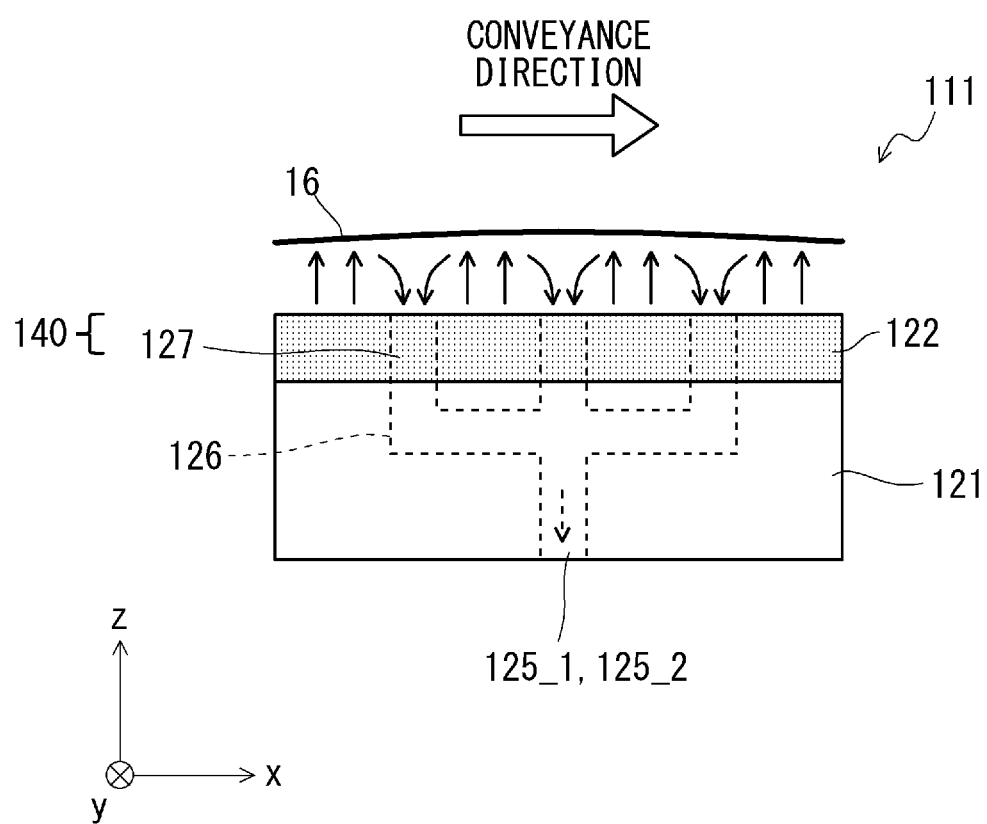
FIG. 12 is a cross section showing a configuration of a precision levitation unit.
Figure 13:
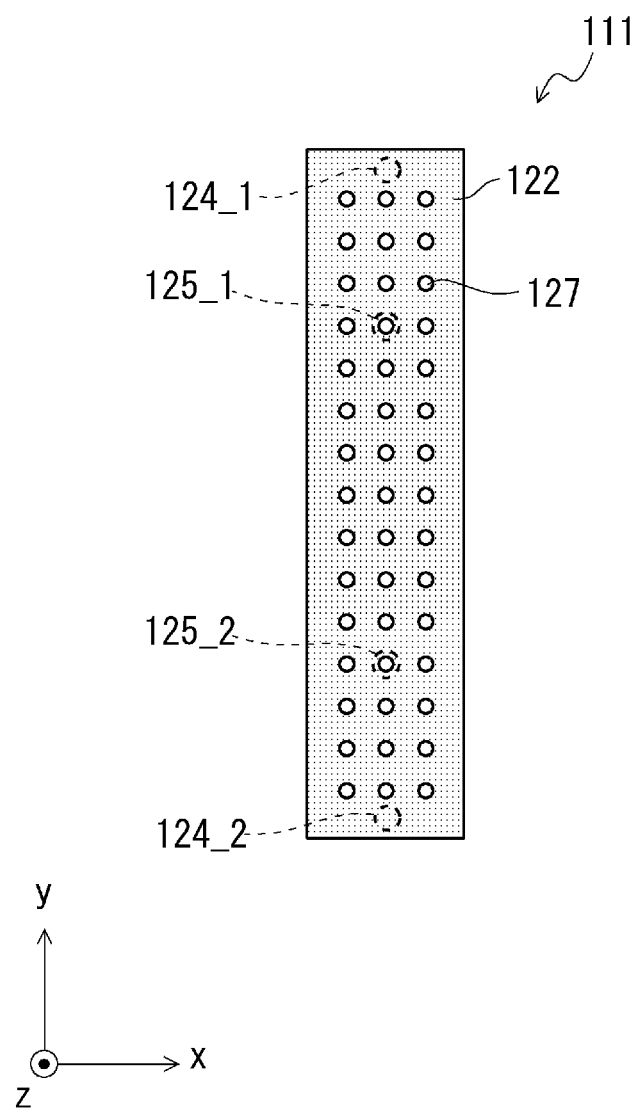
FIG. 13 is a plan view showing a configuration of the precision levitation unit.

FIGS. 12 and 13 are a cross section and a plan view, respectively, for explaining a configuration example of the precision levitation unit 111. As shown in FIG. 12, the precision levitation unit 111 includes a base 121 and a porous element 122. The porous element 122 is disposed above the base 121 and functions as a gas ejecting part.

As shown in the plan view shown in FIG. 13, the porous element 122 is connected to air supply ports 124_1 and 124_2, so that compressed gas is supplied to the porous element 122 through the air supply ports 124_1 and 124_2. For example, the air supply ports 124_1 and 124_2 are disposed in a lower part of the precision levitation unit 111. Note that in the cross section shown in FIG. 13, since the positions of the air supply ports 124_1 and 124_2 coincide with those of the exhaust ports 125_1 and 125_2, illustration of the air supply ports 124_1 and 124_2 is omitted. The compressed gas supplied to the porous element 122 passes through the inside of the porous element 122 and then is ejected upward from the top surface of the porous element 122. As a result, the object to be processed 16 is levitated.

Further, a plurality of intake holes 127 are formed in the porous element 122. The intake holes 127 can be formed by making through-holes in the porous element 122. As shown in FIG. 13, the intake holes 127 are uniformly arranged over the top surface of the porous element 122 (i.e., the surface opposed to the object to be processed 16). The intake holes 127 are arranged at regular intervals in the x-direction and the y-direction. Gas present between the object to be processed 16 and the precision levitation unit 111 (a gas accumulation (see the symbol 145 in FIG. 10)) is sucked through the intake holes 127. As shown in FIG. 12, the intake holes 127 are connected to the exhaust ports 125_1 and 125_2 through flow paths 126. For example, the exhaust ports 125_1 and 125_2 are disposed in the lower part of the precision levitation unit 111. An ejector, a vacuum pump, or the like is connected to the exhaust ports 125_1 and 125_2. By sucking air through the exhaust ports 125_1 and 125_2 (i.e., by bringing the inside of them into a negative-pressure state) by using the ejector, the vacuum pump, or the like, gas present over the top surface of the precision levitation unit 111 can be sucked through the intake holes 127.

As shown in FIG. 12, gas is ejected upward from the porous element 122 in the precision levitation unit 111. Therefore, when the object to be processed 16 is conveyed to an area above the precision levitation unit 111, the ejected gas is blown onto the bottom surface of the object to be processed 16, so that the object to be processed 16 is levitated. Therefore, the precision levitation unit 111 and the object to be processed 16 are brought into a non-contact state. In this state, it is possible to control the gap between the object to be processed 16 and the precision levitation unit 111, i.e., the levitation height of the object to be processed 16 by adjusting the amount of gas supplied to the air supply ports 124_1 and 124_2, i.e., the amount of gas ejected from the porous element 122.

Note that in the precision levitation unit 111, a space that has a negative pressure by the intake of air through the exhaust ports 125_1 and 125_2 (i.e., a space including the intake holes 127 and the flow path 126) is separated from a space that has a positive pressure by the supply of air through the supply ports 124_1 and 124_2. That is, the air tightness between the negative-pressure space and the positive-pressure space is maintained.

Further, it is possible to reduce the warping of the object to be processed 16 by sucking gas (the gas accumulation (see the symbol 145 in FIG. 10)) present between the object to be processed 16 and the precision levitation unit 111 through the intake holes 127. In other words, it is possible to make the object to be processed 16 flat. It is possible to control the amount of the warping of the object to be processed 16 by adjusting the balance between the amount of gas supplied to the air supply ports 124_1 and 124_2 and the amount of gas exhausted from the exhaust ports 125_1 and 125_2.

Note that the amount of ejected gas and the amount of sucked gas may be set as appropriate according to the size of each unit, the porosity of the porous element 122, the arrangement of the intake holes 127, and the like.

As described above, the surface part 140 of the precision levitation unit 111 is formed of a porous material. The semi-precision levitation units 112 and the precision levitation unit 111 are formed of different materials. Even if the semi-precision levitation units 112 and the precision levitation unit 111 expand at different thermal expansion coefficients, it is still possible to prevent the semi-precision levitation unit 111 and the semi-precision levitation units 112 from coming into contact with each other because grooves 115 are interposed between adjacent units. Therefore, it is possible to suppress the generation of particles more reliably.

(Method for Manufacturing Semiconductor Device)

Next, as other embodiments, a method for manufacturing a semiconductor device by using the above-described laser irradiation apparatus is described. In this embodiment, by using a laser annealing apparatus as the laser irradiation apparatus, it is possible to crystallize an amorphous film formed over a substrate by applying laser light to the amorphous film. For example, the semiconductor device is a semiconductor device including TFTs (Thin Film Transistors). In this case, it is possible to form a polysilicon film by applying laser light to an amorphous silicon film and thereby crystallizing the amorphous silicon film.

FIGS. 14 to 18 are cross sections for explaining an example of a method for manufacturing a semiconductor device. The laser irradiation apparatus according to the above-described embodiment is suitable for manufacturing a TFT array substrate. A method for manufacturing a semiconductor device including a TFT is described hereinafter.

Figure 14:
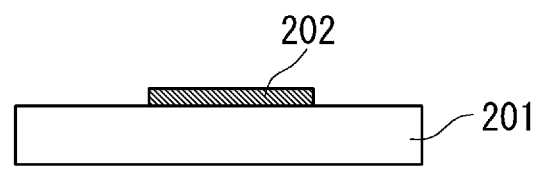
FIG. 14 is a cross section showing a step of a TFT manufacturing method including a laser irradiation method.
Figure 15:
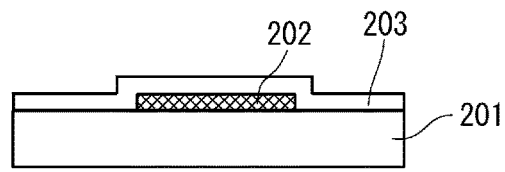
FIG. 15 is a cross section showing a step of the TFT manufacturing method including the laser irradiation method.
Figure 16:
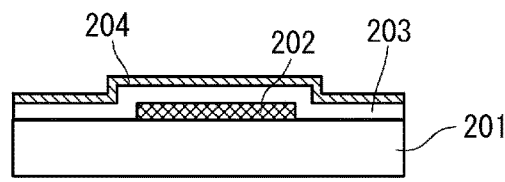
FIG. 16 is a cross section showing a step of the TFT manufacturing method including the laser irradiation method.

Firstly, as shown in FIG. 14, a gate electrode 202 is formed over a glass substrate 201. For example, a metal thin film containing aluminum or the like can be used for the gate electrode 202. Next, as shown in FIG. 15, a gate insulating film 203 is formed over the gate electrode 202. The gate insulating film 203 is formed so as to cover the gate electrode 202. After that, as shown in FIG. 16, an amorphous silicon film 204 is formed over the gate insulating film 203. The amorphous silicon film 204 is disposed so as to be placed over the gate electrode 202 with the gate insulating film 203 interposed therebetween.

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method. The glass substrate 201 with the amorphous silicon film 204 deposited thereon is the object to be processed 16 in the laser irradiation apparatus 1.

Figure 17:
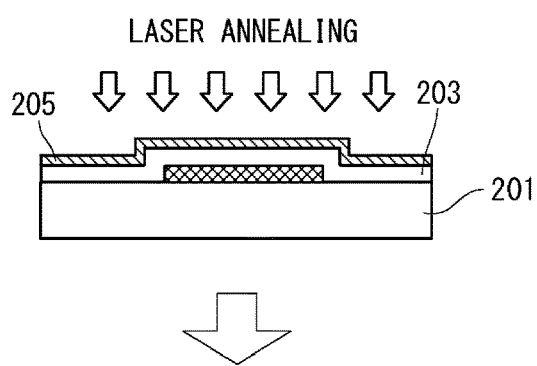
FIG. 17 is a cross section showing a step of the TFT manufacturing method including the laser irradiation method.

Then, as shown in FIG. 17, a polysilicon film 205 is formed by applying laser light to the amorphous silicon film 204 by using the above-described laser irradiation apparatus and thereby crystallizing the amorphous silicon film 204. As a result, the polysilicon film 205 in which silicon is crystallized is formed over the gate insulating film 203.

Note that it is possible to, when laser is applied to the glass substrate 201, reduce the effect of warping thereof by using the laser irradiation apparatus according to the above-described embodiment. Therefore, it is possible to prevent the amorphous silicon film 204 from being displaced from the depth of field (DOF) of the laser light applied thereto. Therefore, it is possible to form a uniformly-crystallized polysilicon film 205.

Figure 18:
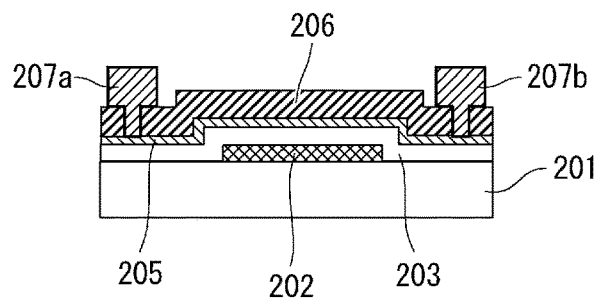
FIG. 18 is a cross section showing a step of the TFT manufacturing method including the laser irradiation method.

After that, as shown in FIG. 18, an inter-layer insulating film 206, a source electrode 207a, and a drain electrode 207b are formed over the polysilicon film 205. The inter-layer insulating film 206, the source electrode 207a, and the drain electrode 207b can be formed by an ordinary photolithography method or an ordinary film forming method.

It is possible to manufacture a semiconductor device including TFTs by using the above-described method for manufacturing a semiconductor device. Note that the subsequent manufacturing process will vary depending on the device that is eventually manufactured, and therefore its description is omitted.

(Organic EL Display)

Figure 19:
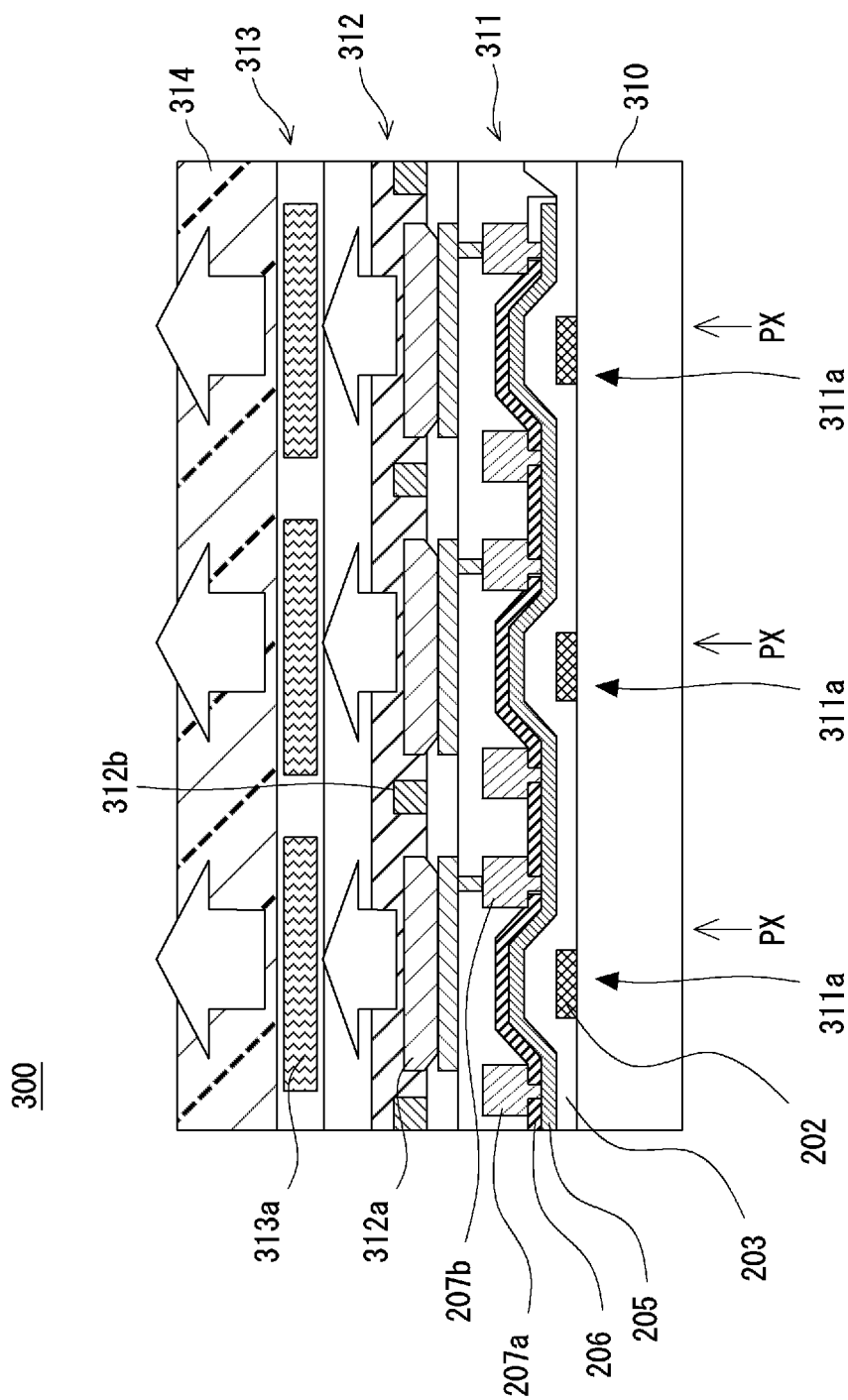
FIG. 19 is a cross section of an organic EL display panel.

Next, as an example of a device using a semiconductor device including TFTs, an organic EL display device is described. FIG. 19 is a cross section for explaining an outline of an organic EL display device, in which pixel circuits of the organic EL display device are illustrated in a simplified manner. The organic EL display device 300 shown in FIG. 19 is an active-matrix-type display device in which a TFT is disposed in each pixel Px.

The organic EL display device 300 includes a substrate 310, a TFT layer 311, an organic layer 312, a color filter layer 313, and a sealing substrate 314. FIG. 19 shows a top-emission-type organic EL display device, in which the side of the sealing substrate 314 is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311a disposed in the respective pixels Px. Further, the TFT layer 311 includes wiring lines connected to the TFTs 311a, and the like. The TFTs 311a, the wirings, and the like constitute pixel circuits. Note that the TFT layer 311 corresponds to the TFT described above with reference to FIG. 19, and includes gate electrodes 202, a gate insulating film 203, a polysilicon film 205, an inter-layer insulating film 206, source electrodes 207a, and drain electrodes 207b.

The organic layer 312 is provided over the TFT layer 311. The organic layer 312 includes an organic EL light-emitting element 312a disposed in each pixel Px. The organic EL light-emitting element 312a has, for example, a laminated configuration in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312b for separating organic EL light-emitting elements 312a are provided between pixels Px.

The color filter layer 313 is provided over the organic layer 312. The color filter layer 313 includes color filters 313a for performing color displaying. That is, in each pixel PX, a resin layer colored in R (red), G (green), or B (blue) is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel Px by supplying a display signal corresponding to a display image to each pixel Px. As a result, it is possible to display a desired image.

Note that although the organic EL display device has been described above as an example of a device using a semiconductor device including TFTs, the semiconductor device including TFTs may be other types of display devices such as a liquid crystal display device. Further, cases where the laser irradiation apparatus according to this embodiment is applied to a laser annealing apparatus have been described above. However, the laser irradiation apparatus according to this embodiment can also be applied to apparatuses other than the laser annealing apparatus.

The present invention made by the inventors of the present application has been explained above in a concrete manner based on embodiments. However, the present invention is not limited to the above-described embodiments, and needless to say, various modifications can be made without departing from the spirit and scope of the present invention.

This application is based upon and claims the benefit of priority from Japanese patent application No. 2017-162115, filed on Aug. 25, 2017, the disclosure of which is incorporated herein in its entirety by reference.

REFERENCE SIGNS LIST

1 LASER IRRADIATION DEVICE
10 LEVITATION UNIT
11 CONVEYANCE UNIT
12 HOLDING MECHANISM
13 MOVING MECHANISM
14 LASER GENERATION APPARATUS
15 LASER IRRADIATION PLACE
16 OBJECT TO BE PROCESSED
31 PRECISION LEVITATION AREA
32 SEMI-PRECISION LEVITATION AREA
33 ROUGH LEVITATION AREA
111 PRECISION LEVITATION UNIT
112 SEMI-PRECISION LEVITATION UNIT
113 ROUGH LEVITATION UNIT
114 BASE UNIT
115 GROOVE
121 BASE
122 POROUS ELEMENT
131 METAL MEMBER
132 SURFACE TREATMENT PART
133 SUPPLY FLOW PATH
134 SUPPLY PORT
135 INTAKE PORT
136 INTAKE FLOW PATH
137 INTAKE HOLE
138 EJECTION HOLE
140 SURFACE PART
145 GAS ACCUMULATION
146 DAMAGED PART

The invention claimed is:

1. A laser irradiation apparatus comprising:
a laser generation device configured to generate laser light;
a levitation unit configured to levitate an object to be processed to which the laser light is applied; and
a conveyance unit configured to convey the object in a conveyance direction while the object is levitated by the levitation unit,
wherein
the levitation unit includes a first area and a second area,
the first area configured to eject gas upward,
the second area configured to eject gas toward the object and disposed on both sides of the first area in the conveyance direction,
the first and second areas are arranged so that, in a plane view, a focal point of the laser light overlaps the first area and the focal point of the laser light does not overlap the second area,
a porous element is provided in a surface part of the first area, a metal member with no intake hole is provided in a surface part of the second area, the levitation unit further comprises a third area disposed between the first and second areas in the conveyance direction, a plurality of metal members are provided in a surface part of the third area, and a plurality of ejection holes and a plurality of intake holes are provided in the plurality of metal members provided in the third area, the plurality of intake holes being configured so that gas present between the object to be processed and the levitation unit can be sucked therethrough.

2. The laser irradiation apparatus according to claim 1, wherein antistatic treatment is performed on a top surface of the metal member.

3. The laser irradiation apparatus according to claim 1, wherein the metal member is formed of aluminum or stainless steel.

4. The laser irradiation apparatus according to claim 1, wherein the surface part of the second area is formed by arranging a plurality of metal members.

5. The laser irradiation apparatus according to claim 4, wherein
a groove is formed between two adjacent metal members;
a width of the groove is smaller than a width of the metal member.

6. The laser irradiation apparatus according to claim 1, wherein a plurality of ejection holes are provided in the metal member, the plurality of ejection holes being configured so that gas is ejected upward therethrough.

7. The laser irradiation apparatus according to claim 1, wherein gas is ejected from the porous element to the object to be processed.

8. The laser irradiation apparatus according to claim 1, wherein a plurality of intake holes are provided in the porous element, the plurality of intake holes being configured so that gas present between the object to be processed and the levitation unit can be sucked therethrough.

9. The laser irradiation apparatus according to claim 1, wherein
the levitation unit comprises a base unit,
the porous element is disposed over the base unit in the first area, and
a plurality of metal members are provided over the base unit in the second area.

10. The laser irradiation apparatus according to claim 1, wherein
the plurality of ejection holes are configured so that gas is ejected upward therethrough.

11. A laser irradiation apparatus comprising:
a laser generation device configured to generate laser light;
a levitation unit configured to levitate an object to be processed to which the laser light is applied; and
a conveyance unit configured to convey the object in a conveyance direction while the object is levitated by the levitation unit,
wherein
the levitation unit includes a first area and a second area,
the first area configured to eject gas upward,
the second area configured to eject gas toward the object and disposed on both sides of the first area in the conveyance direction, the first and second areas are arranged so that, in a plane view, a focal point of the laser light overlaps the first area and the focal point of the laser light does not overlap the second area, a metal member with no intake hole is provided in a surface part of the second area, a porous element is provided in the surface part of the first area, the porous element being adapted so that gas is ejected therethrough to the object to be processed, a plurality of intake holes are provided in the porous element, the plurality of intake holes being configured so that gas present between the object to be processed and the levitation unit can be sucked therethrough, the levitation unit further comprises a third area disposed between the first and second areas in the conveyance direction, a plurality of metal members are provided in a surface part of the third area, and a plurality of ejection holes and a plurality of intake holes are provided in the plurality of metal members provided in the third area, the plurality of intake holes being configured so that gas present between the object to be processed and the levitation unit can be sucked therethrough.

12. A laser irradiation method for applying laser light to an object to be processed in a conveyance direction by conveying the object to be processed using a conveyance unit while levitating the object to be processed using a levitation unit, wherein
the levitation unit includes a first area and a second area,
the first area configured to eject gas upward,
the second area configured to eject gas toward the object and disposed on both sides of the first area in the conveyance direction,
the first and second areas are arranged so that, in a plane view, a focal point of the laser light overlaps the first area and the focal point of the laser light does not overlap the second area,
a surface part of the first area is formed of a porous member,
a surface part of the second area is formed of a metal member with no intake hole,
the levitation unit further comprises a third area disposed between the first and second areas in the conveyance direction,
a surface part of the third area is formed of a plurality of metal members, and
a plurality of ejection holes and a plurality of intake holes are provided in the plurality of metal members provided in the third area, the plurality of intake holes being configured so that gas present between the object to be processed and the levitation unit can be sucked therethrough.

13. A method for manufacturing a semiconductor device, comprising the steps of:
(a) forming an amorphous film over a substrate; and
(b) crystallizing the amorphous film by applying laser light to the amorphous film, wherein
the step (b) is a step of applying the laser light to the amorphous film while levitating and conveying the substrate using a levitation unit,
the substrate is conveyed in a conveyance direction,
the levitation unit comprises a first area and a second area, the first area being disposed so as to overlap a focal point of the laser light in a plane view, the second area being disposed so as not to overlap the focal point of the laser light in the plane view, the first area configured to eject gas upward,
the second area configured to eject gas toward the object and disposed on both sides of the first area in the conveyance direction,
a surface part of the first area is formed of a porous member,
a surface part of the second area is formed of a metal member with no intake hole,
the levitation unit further comprises a third area disposed between the first and second areas in the conveyance direction,
a surface part of the third area is formed of a plurality of metal members, and
a plurality of ejection holes and a plurality of intake holes are provided in the plurality of metal members provided in the third area, the plurality of intake holes being configured so that gas present between the object to be processed and the levitation unit can be sucked therethrough.

* * * * *